US008686990B2

(12) United States Patent
Yamamoto

(10) Patent No.: US 8,686,990 B2
(45) Date of Patent: Apr. 1, 2014

(54) SCANNING SIGNAL LINE DRIVE CIRCUIT AND DISPLAY DEVICE EQUIPPED WITH SAME

(75) Inventor: Kaoru Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/885,101

(22) PCT Filed: Apr. 2, 2012

(86) PCT No.: PCT/JP2012/058918
§ 371 (c)(1),
(2), (4) Date: May 13, 2013

(87) PCT Pub. No.: WO2012/137728
PCT Pub. Date: Oct. 11, 2012

(65) Prior Publication Data
US 2013/0235026 A1  Sep. 12, 2013

(30) Foreign Application Priority Data

Apr. 8, 2011  (JP) .................................. 2011-086401

(51) Int. Cl.
G06F 3/038  (2013.01)
G09G 5/00  (2006.01)
G09G 3/36  (2006.01)

(52) U.S. Cl.
USPC ........................................... 345/214; 345/98

(58) Field of Classification Search
USPC .......................................................... 345/214
See application file for complete search history.

(56) References Cited

U.S. PATENT DOCUMENTS

| 6,380,919 | B1 | 4/2002 | Koyama et al. | |
|---|---|---|---|---|
| 2001/0011987 | A1* | 8/2001 | Kubota et al. | 345/98 |
| 2005/0212746 | A1 | 9/2005 | Iwasaki et al. | |
| 2006/0152459 | A1 | 7/2006 | Shin | |
| 2009/0278776 | A1 | 11/2009 | Pai et al. | |
| 2010/0123654 | A1 | 5/2010 | Kimura | |
| 2010/0220092 | A1 | 9/2010 | Kimura | |
| 2010/0238143 | A1 | 9/2010 | Liu et al. | |

FOREIGN PATENT DOCUMENTS

| JP | 8-320674 A | 12/1996 |
|---|---|---|
| JP | 9-152574 A | 6/1997 |
| JP | 11-352938 A | 12/1999 |

(Continued)

OTHER PUBLICATIONS

Official Communication issued in International Patent Application No. PCT/JP2012/058918, mailed on May 1, 2012.

*Primary Examiner* — Charles V Hicks
(74) *Attorney, Agent, or Firm* — Keating & Bennett, LLP

(57) ABSTRACT

Provided is a monolithic gate driver capable of performing block-reversal driving without causing deterioration of display quality or an increase in power consumption. Gate bus lines are divided into z blocks. A gate driver (400) is provided with a block scanning circuit (40), as well as odd-numbered line scanning circuits (42) each provided for each block and even-numbered line scanning circuits (44) each provided for each block. The block scanning circuit (40) sequentially selects the first to z-th blocks one by one, and alternately selects the odd-numbered line scanning circuits (42) and the even-numbered line scanning circuits (44). Each of the odd-numbered line scanning circuits (42) sequentially and selectively drives the odd-numbered gate bus lines included in the corresponding block. Each of the even-numbered line scanning circuits (44) sequentially and selectively drives the even-numbered gate bus lines included in the corresponding block.

11 Claims, 12 Drawing Sheets

(56) References Cited

FOREIGN PATENT DOCUMENTS

| | | |
|---|---|---|
| JP | 2003-140624 A | 5/2003 |
| JP | 2005-285168 A | 10/2005 |
| JP | 2006-154810 A | 6/2006 |
| JP | 2008-242144 A | 10/2008 |
| JP | 2010-097170 A | 4/2010 |
| JP | 2010-224531 A | 10/2010 |
| TW | 200947399 A1 | 11/2009 |
| TW | 201033986 A1 | 9/2010 |
| TW | 201035940 A1 | 10/2010 |

* cited by examiner

SCANNING SIGNAL LINE DRIVE CIRCUIT AND DISPLAY DEVICE EQUIPPED WITH SAME

TECHNICAL FIELD

The present invention relates to a display device and a drive circuit of the display device, and in particular to a scanning signal line drive circuit (gate driver) for driving scanning signal lines provided for a display unit of the display device.

BACKGROUND ART

Conventionally, there have been known an active matrix-type liquid crystal display device having TFTs (thin-film transistors) as switching elements. This liquid crystal display device is provided with a liquid crystal panel constituted by two insulating substrates facing toward each other. One of the substrates of the liquid crystal panel is provided with gate bus lines (scanning signal lines) and source bus lines (video signal lines) arranged in matrix, and is provided with TFTs that are provided near intersections between the gate bus lines and the source bus lines. Each of the TFTs is configured by a gate terminal connected to a corresponding one of the gate bus lines, a source terminal connected to a corresponding one of the source bus lines, and a drain terminal. The drain terminals are connected respectively to pixel electrodes, which are arranged in matrix on the substrate in order to form an image. The other of the substrates of the liquid crystal panel is provided with a common electrode (also known as an "opposite electrode") for applying a voltage between the common electrode and the pixel electrodes through the liquid crystal. In the configuration described above, based on a video signal that the source terminal of each TFT receives from the source bus line when the gate terminal of this TFT receives an active scanning signal from the gate bus line, a voltage is applied between the pixel electrode and the common electrode. This drives the liquid crystal, and a desired image is displayed on a screen.

In the meantime, the liquid crystal have a property that they deteriorate if a direct voltage continues to be applied. Accordingly, in the liquid crystal display device, an alternating voltage is applied to the liquid crystal. Such an application of the alternating voltage is realized by reversing polarities of a pixel voltage (a potential of the pixel electrode in reference to a potential of the common electrode) every single frame period in each pixel formation portion (region constituting a single pixel that is a minimum unit forming an image). As a technique for realizing high-quality display while performing alternating driving, driving methods such as line-reversal driving and dot-reversal driving have been known.

The line-reversal driving is a driving method in which polarities of the pixel voltages are reversed every single frame period and every single gate bus line (line by line). When the line-reversal driving is employed, the polarities of the pixel voltages in two consecutive frame periods are as illustrated in FIG. 12, for example. On the other hand, the dot-reversal driving is a driving method in which polarities of the pixel voltages are reversed every single frame period and every single gate bus line, and polarities between adjacent pixel formation portions in a lateral (horizontal) direction are reversed during a single frame period. When the dot-reversal driving is employed, the polarities of the pixel voltages in two consecutive frame periods are as illustrated in FIG. 13, for example. It should be noted that, FIG. 12 and FIG. 13 illustrate the polarities of the pixel voltages in (16×8) pixel formation portions provided respectively corresponding to inter- sections between sixteen gate bus lines GL1 to GL16 and eight source bus lines SL1 to SL8.

Japanese Patent Application Laid-Open No. H11-352938 proposes a driving method for reducing power consumption of a display device employing the line-reversal driving or the dot-reversal driving. According to this driving method, gate bus lines are divided into a plurality of blocks, and sequential selection is performed to the plurality of blocks one by one while interlaced scanning is performed to the plurality of gate bus lines included in each block. For example, in a case in which eight gate bus lines GL1 to GL8 are divided into two blocks, the gate bus lines are selected in an order of "GL1, GL3, GL2, GL4, GL5, GL7, GL6, and GL8" as illustrated in FIG. 14. Accordingly, in order to obtain the polarities of the pixel voltages as illustrated in FIG. 12 or FIG. 13, it is only necessary to reverse the polarities of the video signals every two horizontal scanning periods instead of every single horizontal scanning period. As a result, power consumption is reduced.

It should be noted that, in this description, a driving method that satisfies items (1) to (4) listed below as the driving method disclosed in Japanese Patent Application Laid-Open No. H11-352938 is called "block-reversal driving".

(1) Gate bus lines are divided into a plurality of blocks, and sequential selection is performed to the plurality of blocks one by one.
(2) Interlaced scanning is performed to the plurality of gate bus lines included in each block. With this, for each block, two vertical scannings (a scanning for selecting an odd-numbered line and a scanning for selecting an even-numbered line) are performed in a single frame period.
(3) In the two vertical scannings in the single frame period, polarities of video signals to be applied to source bus lines are reversed between the vertical scanning of the first time and the vertical scanning of the second time.
(4) In each of the pixel formation portions, polarities of pixel voltages are reversed every single frame period.

Further, relating to the present invention, there are also known conventional techniques as described below. Japanese Patent Application Laid-Open No. 2006-154810 discloses the invention of a scanning driver (gate driver) capable of performing sequential scanning and interlaced scanning selectively. Japanese Patent Application Laid-Open No. H08-320674 discloses that, in addition to the interlaced scanning, by reversing polarities of display signals (video signals) supplied to data lines (source bus lines) every predetermined period, it is possible to obtain excellent image quality as well as to reduce power consumption.

PRIOR ART DOCUMENTS

Patent Documents

[Patent Document 1] Japanese Patent Application Laid-Open No. H11-352938
[Patent Document 2] Japanese Patent Application Laid-Open No. 2006-154810
[Patent Document 3] Japanese Patent Application Laid-Open No. H08-320674

SUMMARY OF THE INVENTION

Problems to be Solved by the Invention

In the meantime, as for the liquid crystal display device, in recent years, a gate driver (scanning signal line drive circuit) for driving gate bus lines has become increasingly monolithic. Monolithical provision is employed in order to provide a slimmer picture-frame for a liquid crystal panel, for example. Conventionally, a gate driver has mostly been mounted as an IC (Integrated Circuit) chip on a peripheral part of a substrate that constitutes a liquid crystal panel. However, in recent years, it has gradually become more common to provide a gate driver directly on a substrate. Such a gate driver is called a "monolithic gate driver" and such. In a liquid crystal display device provided with a monolithic gate driver, a TFT using amorphous silicon (a-Si TFT) has typically been employed as a drive element. On the other hand, a configuration in which a TFT using polycrystalline silicon, microcrystalline silicon, oxide semiconductor (e.g., IGZO), or the like is employed as a drive element has also been proposed in recent years.

However, there has been no monolithic gate driver that is able to perform the block-reversal driving described above. Further, as for an amorphous silicon, it is not possible to employ a CMOS configuration, because the mobility of P-type is low. Therefore, in a display device, such as a large-sized liquid crystal panel, in which an amorphous silicon TFT is employed as a drive element, it is necessary to configure a circuit using a single channel TFT. As a result, it has been difficult to realize a circuit configuration that allows a complex driving method such as the block-reversal driving.

Thus, an object of the present invention is to provide a monolithic gate driver capable of performing the block-reversal driving without causing deterioration of display quality or an increase in power consumption.

Means for Solving the Problems

A first aspect of the present invention is directed to a scanning signal line drive circuit provided monolithically on a substrate that constitutes a display panel, and for driving a plurality of scanning signal lines arranged on the substrate, the scanning signal line drive circuit comprising:

a plurality of odd-numbered line scanning circuits configured to drive odd-numbered scanning signal lines out of the plurality of scanning signal lines;

a plurality of even-numbered line scanning circuits configured to drive even-numbered scanning signal lines out of the plurality of scanning signal lines; and a selection circuit configured to select a circuit to be activated out of the plurality of odd-numbered line scanning circuits and the plurality of even-numbered line scanning circuits, wherein the plurality of scanning signal lines are divided into z blocks (z is an integer equal to or greater than 2) such that each block includes k consecutive scanning signal lines (k is an integer equal to or greater than 4), one of the odd-numbered line scanning circuits and one of the even-numbered line scanning circuits are provided for each block, the selection circuit sequentially selects the first to z-th blocks one by one, and alternately selects the odd-numbered line scanning circuits and the even-numbered line scanning circuits, each of the odd-numbered line scanning circuits sequentially and selectively drives the odd-numbered scanning signal lines that are included in the corresponding block, and each of the even-numbered line scanning circuits sequentially and selectively drives the even-numbered scanning signal lines that are included in the corresponding block.

According to a second aspect of the present invention, in the first aspect of the present invention, the selection circuit, the odd-numbered line scanning circuits, and the even-numbered line scanning circuits are each configured by a shift register having a plurality of stages each configured to output, based on an externally inputted clock signal, a state signal indicating one of a first state and a second state, and each of the stages that constitute the shift register includes:
an output node for outputting the state signal;
an output-controlling switching element having a second electrode to which the clock signal is supplied and a third electrode connected to the output node;
a first node connected to a first electrode of the output-controlling switching element;
a capacitative element provided between the output node and the first node;
a first-node charging unit configured to charge the first node based on one of a start instructing signal and the state signal outputted from the output node of a previous stage;
a first-node discharging unit configured to discharge the first node based on the state signal outputted from the output node of a next stage; and
an output-node discharging unit configured to discharge the output node based on the state signal outputted from the output node of the next stage.

According to a third aspect of the present invention, in the second aspect of the present invention, in each of the stages that constitute the shift register, the clock signal supplied to the second electrode of the output-controlling switching element changes from a low level to a high level, after the first node is charged by the first-node charging unit and before the first node is discharged by the first-node discharging unit.

According to a fourth aspect of the present invention, in the second or third aspect of the present invention, a first stage of the shift register that constitutes the odd-numbered line scanning circuit is supplied with, as the start instructing signal, the state signal outputted from an odd-numbered stage of the shift register that constitutes the selection circuit, a first stage of the shift register that constitutes the even-numbered line scanning circuit is supplied with, as the start instructing signal, the state signal outputted from an even-numbered stage of the shift register that constitutes the selection circuit, the odd-numbered scanning signal lines out of the plurality of scanning signal lines are each supplied with, as a scanning signal, the state signal outputted from each stage of the shift register that constitutes the odd-numbered line scanning circuit, and the even-numbered scanning signal lines out of the plurality of scanning signal lines are each supplied with, as the scanning signal, the state signal outputted from each stage of the shift register that constitutes the even-numbered line scanning circuit.

According to a fifth aspect of the present invention, in the first aspect of the present invention, the selection circuit, the odd-numbered line scanning circuits, and the even-numbered line scanning circuits are each configured by a shift register having a plurality of stages each configured to output, based on an externally inputted clock signal, a state signal indicating one of a first state and a second state, a first stage of the shift register that constitutes the odd-numbered line scanning circuit is supplied with, as a start instructing signal, the state signal outputted from an odd-numbered stage of the shift register that constitutes the selection circuit, a first stage of the shift register that constitutes the even-numbered line scanning circuit is supplied with, as the start instructing signal, the state signal outputted from an even-numbered stage of the shift register that constitutes the selection circuit, the odd-numbered scanning signal lines out of the plurality of scanning signal lines are each supplied with, as a scanning signal, the state signal outputted from each stage of the shift register that constitutes the odd-numbered line scanning circuit, and the even-numbered scanning signal lines out of the plurality of scanning signal lines are each supplied with, as the scanning signal, the state signal outputted from each stage of the shift register that constitutes the even-numbered line scanning circuit.

According to a sixth aspect of the present invention, in the second aspect of the present invention, in each of the stages that constitute the shift register,
the first-node charging unit includes a first switching element having a first electrode and a second electrode to both of which the state signal outputted from the output node of the previous stage is supplied and a third electrode connected to the first node, and
the first-node discharging unit includes a second switching element having a first electrode to which the state signal outputted from the output node of the next stage is supplied, a second electrode connected to the first node, and a third electrode to which a low level potential is supplied.

According to a seventh aspect of the present invention, in the second aspect of the present invention, in each of the stages that constitute the shift register,
the output-node discharging unit includes a third switching element having a first electrode to which the state signal outputted from the output node of the previous stage is supplied, a second electrode connected to the output node, and a third electrode to which a low level potential is supplied.

According to an eighth aspect of the present invention, in the second aspect of the present invention, each of the stages that constitute the shift register further includes a fourth switching element having a first electrode to which an externally inputted clear signal is supplied, a second electrode connected to the output node, and a third electrode to which a low level potential is supplied.

According to a ninth aspect of the present invention, in the second aspect of the present invention, each of the stages that constitute the shift register further includes a fifth switching element having a first electrode to which an externally inputted clear signal is supplied, a second electrode connected to the first node, and a third electrode to which a low level potential is supplied.

According to a tenth aspect of the present invention, in any of the second to ninth aspects of the present invention, the switching element included in each of the stages that constitute the shift register is a thin-film transistor made of amorphous silicon.

According to an eleventh aspect of the present invention, in any of the second to ninth aspects of the present invention, the switching element included in each of the stages that constitute the shift register is a thin-film transistor made of N-type oxide semiconductor comprising indium, gallium, zinc, and oxygen.

According to a twelfth aspect of the present invention, in the first aspect of the present invention, the selection circuit, the odd-numbered line scanning circuits, and the even-numbered line scanning circuits are each configured by a shift register having a plurality of stages each configured to output, based on an externally inputted clock signal, a state signal indicating one of a first state and a second state, each of the stages that constitute the shift register is a master-slave type flip flop realized by a CMOS logic circuit, the master-slave type flip flop including a master flip flop configured to take in input data based on the clock signal and a slave flip flop configured to output, as the state signal, the data taken in by the master flip flop based on the clock signal, a first stage of the shift register that constitutes the odd-numbered line scanning circuit is supplied with, as the input data, the state signal outputted from an odd-numbered stage of the shift register that constitutes the selection circuit, second and subsequent stages of the shift register that constitutes the odd-numbered line scanning circuit are supplied with, as the input data, the state signal outputted from a previous stage, a first stage of the shift register that constitutes the even-numbered line scanning circuit is supplied with, as the input data, the state signal outputted from an even-numbered stage of the shift register that constitutes the selection circuit, second and subsequent stages of the shift register that constitutes the even-numbered line scanning circuit are supplied with, as the input data, the state signal outputted from the previous stage, the odd-numbered scanning signal lines out of the plurality of scanning signal lines are each supplied with, as a scanning signal, the state signal outputted from each stage of the shift register that constitutes the odd-numbered line scanning circuit, and the even-numbered scanning signal lines out of the plurality of scanning signal lines are each supplied with, as the scanning signal, the state signal outputted from each stage of the shift register that constitutes the even-numbered line scanning circuit.

According to a thirteenth aspect of the present invention, in the twelfth aspect of the present invention, the CMOS logic circuit included in each of the stages that constitute the shift register is configured by a thin-film transistor made of polycrystalline silicon.

A fourteenth aspect of the present invention is directed to a display device, comprising:

the scanning signal line drive circuit according to any one of the first to thirteenth aspects of the present invention; and a video signal line drive circuit configured to drive a plurality of video signal lines provided on the substrate, wherein focusing on video signals applied respectively to the video signal lines, the video signal line drive circuit makes polarities of the video signals when the odd-numbered line scanning circuit is selected by the selection circuit different from the polarities of the video signals when the even-numbered line scanning circuit is selected by the selection circuit.

According to a fifteenth aspect of the present invention, in the fourteenth aspect of the present invention, the video signal line drive circuit makes polarities of the video signals applied to two adjacent video signal lines different from each other.

Effects of the Invention

According to the first aspect of the present invention, th plurality of scanning signal lines are divided into z blocks such that each block includes four or more consecutive gate bus lines. As the selection circuit alternately selects the odd-numbered line scanning circuits and the even-numbered line scanning circuits, in each block, the odd-numbered scanning signal lines are sequentially selected one by one in first vertical scanning, and then, the even-numbered scanning signal lines are sequentially selected one by one in second vertical scanning. Here, the block-reversal driving is realized by reversing polarities of each video signal between the first vertical scanning and the second vertical scanning, and by also reversing polarities of each video signal every single frame period. At this time, as a number of the polarity reversal of the video signal performed in a single frame period is reduced, it is possible to reduce power consumption as compared to line-reversal driving and dot-reversal driving. In this manner, in the scanning signal line drive circuit that is monolithically provided, it is possible to perform the block-reversal driving without causing deterioration of display quality or an increase in power consumption.

According to the second aspect of the present invention, in the monolithically provided scanning signal line drive circuit having the shift registers utilizing bootstrap, it is possible to perform the block-reversal driving without causing deterioration of display quality or an increase in power consumption.

According to the third aspect of the present invention, the first node is bootstrapped at suitable timing in each stage of the shift registers.

According to the fourth aspect of the present invention, it is possible to obtain the same effect as that of the second or third aspect of the present invention without increasing complexity of the circuit configuration within the scanning signal line drive circuit.

According to the fifth aspect of the present invention, it is possible to obtain the same effect as that of the first aspect of the present invention without increasing complexity of the circuit configuration within the scanning signal line drive circuit.

According to the sixth aspect of the present invention, it is possible to obtain the same effect as that of the second aspect of the present invention without increasing complexity of the circuit configuration of the shift register.

According to the seventh aspect of the present invention, it is possible to obtain the same effect as that of the second aspect of the present invention without increasing complexity of the circuit configuration of the shift register.

According to the eighth aspect of the present invention, the potential of the output node is turned to the low level (initial state) based on the clear signal. Therefore, it is possible to suppress an occurrence of a false operation by driving the clear signal to an ON level at appropriate timing.

According to the ninth aspect of the present invention, the potential of the first node is turned to the low level (initial state) based on the clear signal. Therefore, it is possible to suppress an occurrence of a false operation by driving the clear signal to an ON level at appropriate timing.

According to the tenth aspect of the present invention, in the monolithically provided scanning signal line drive circuit for a display device employing the amorphous silicon TFT as a drive element (e.g., a large-sized liquid crystal panel), it is possible to perform the block-reversal driving without causing deterioration of display quality or an increase in power consumption.

According to the eleventh aspect of the present invention, in the monolithically provided scanning signal line drive circuit for a display device employing the IGZO-TFT as a drive element, it is possible to perform the block-reversal driving without causing deterioration of display quality or an increase in power consumption. Further, as mobility of IGZO has high, it is possible to improve a driving capability of the scanning signal line drive circuit and to provide a slimmer picture-frame by reducing a size of the TFT. Moreover, as a load capacitance is reduced, it is possible to significantly reduce the power consumption. Furthermore, as a leakage in the IGZO-TFT is low, in a circuit using bootstrap, for example, it is possible to suppress an occurrence of a faulty operation due to a leakage of an electric charge from a floating node, and to increase an operation margin.

According to the twelfth aspect of the present invention, in the monolithically provided scanning signal line drive circuit having the shift registers utilizing the master-slave type flip flops, it is possible to perform the block-reversal driving without causing deterioration of display quality or an increase in power consumption. In addition, as the shift registers are configured using the CMOS logic circuits, the power consumption is effectively reduced.

According to the thirteenth aspect of the present invention, in the monolithically provided scanning signal line drive circuit for a display device employing the polycrystalline silicon TFT as a drive element, it is possible to perform the block-reversal driving without causing deterioration of display quality or an increase in power consumption.

According to the fourteenth aspect of the present invention, it is possible to realize the display device having the monolithically provided scanning signal line drive circuit capable of performing the block-reversal driving without causing deterioration of display quality or an increase in power consumption.

According to the fifteenth aspect of the present invention, as the polarities of the pixel voltages are different from each other (in a reversal state) between adjacent pixels both in a lateral (horizontal) direction and in a longitudinal (vertical) direction, it is possible to display with higher quality.

MODE FOR CARRYING OUT THE INVENTION

Hereinafter, one embodiment according to the present invention will be described with reference to the appended drawings. It should be noted that in the following description, a gate terminal (gate electrode), a drain terminal (drain electrode), and a source terminal (source electrode) of a thin-film transistor respectively correspond to a first electrode, a second electrode, and a third electrode.

<1. Overall Configuration and Operation>

Figure 2:
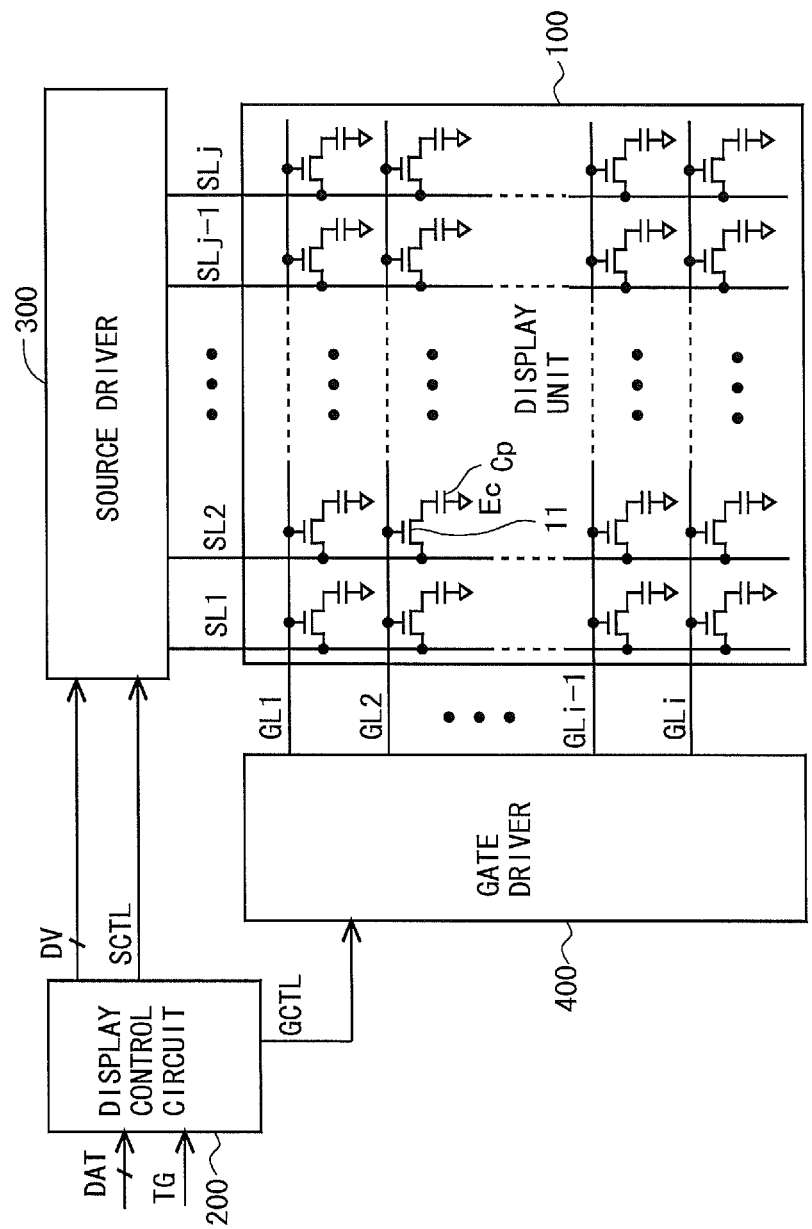
FIG. 2 is a block diagram illustrating an overall configuration of the liquid crystal display device according to this embodiment.

FIG. 2 is a block diagram illustrating an overall configuration of an active matrix-type liquid crystal display device according to one embodiment of the present invention. As illustrated in FIG. 2, this liquid crystal display device is provided with a display unit 100, a display control circuit 200, a source driver (video signal line drive circuit) 300, and a gate driver (scanning signal line drive circuit) 400. The display unit 100 includes a plurality of (j) source bus lines (video signal lines) SL1 to SLj, a plurality of (i) gate bus lines (scanning signal lines) GL1 to GLi, and a plurality of (i×j) pixel formation portions provided respectively corresponding to intersections between the source bus lines SL1 to SLj and the gate bus lines GL1 to GLi. The plurality of pixel formation portions are arranged in matrix to constitute a pixel array. Each of the pixel formation portions is configured by a thin-film transistor (TFT) 11 as a switching element having a gate terminal connected to a gate bus line that passes a corresponding one of the intersections and a source terminal connected to a source bus line that passes this intersection, a pixel electrode connected to a drain terminal of the thin-film transistor 11, a common electrode Ec that is an opposite electrode provided in common to the plurality of pixel formation portions, and a liquid crystal layer provided in common to the plurality of pixel formation portions and sandwiched between the pixel electrodes and the common electrode Ec. Further, a liquid crystal capacitance constituted by the pixel electrode and the common electrode Ec constitutes a pixel capacitance Cp.

While an auxiliary capacitance is generally provided in parallel with the liquid crystal capacitance in order to reliably maintain an electric charge in the pixel capacitance Cp, a description and illustration of the auxiliary capacitance is omitted as the auxiliary capacitance is not directly related to the present invention.

The display control circuit 200 receives an externally supplied data signal DAT and externally supplied timing control signals (such as a horizontal synchronizing signal and a vertical synchronizing signal) TG, and outputs a digital video signal DV, a source control signal SCTL for controlling an operation of the source driver 300, and a gate control signal GCTL for controlling an operation of the gate driver 400. Each of the source control signal SCTL and the gate control signal GCTL is configured by a plurality of signals. The source control signal SCTL includes, for example, a start pulse signal, a clock signal, and the like that are for controlling an operation of a shift register within the source driver 300. The gate control signal GCTL will be described later in detail.

The source driver 300 receives the digital video signal DV and the source control signal SCTL that are outputted from the display control circuit 200, and applies driving video signals to the source bus lines SL1 to SLj.

Based on the gate control signal GCTL outputted from the display control circuit 200, the gate driver 400 repeats application of active scanning signals (output of scanning pulses) to the gate bus lines GL1 to GLi with a cycle of a single vertical scanning period. The gate driver 400 will be described later in detail. It should be noted that, in this embodiment, the gate driver 400 is provided on one of two substrates (glass substrates) that constitute a liquid crystal panel including the display unit 100. Specifically, the gate driver 400 according to this embodiment is a monolithic gate driver. Further, in this embodiment, an amorphous silicon TFT is employed as a drive element.

In the above described manner, an image based on the externally supplied image signal DAT is displayed in the display unit 100 by applying the driving video signals respectively to the source bus lines SL1 to SLj and by applying the scanning signals respectively to the gate bus lines GL1 to GLi.

<2. Configuration of Gate Driver>
<2.1 Schematic Configuration of Gate Driver>

Figure 3:
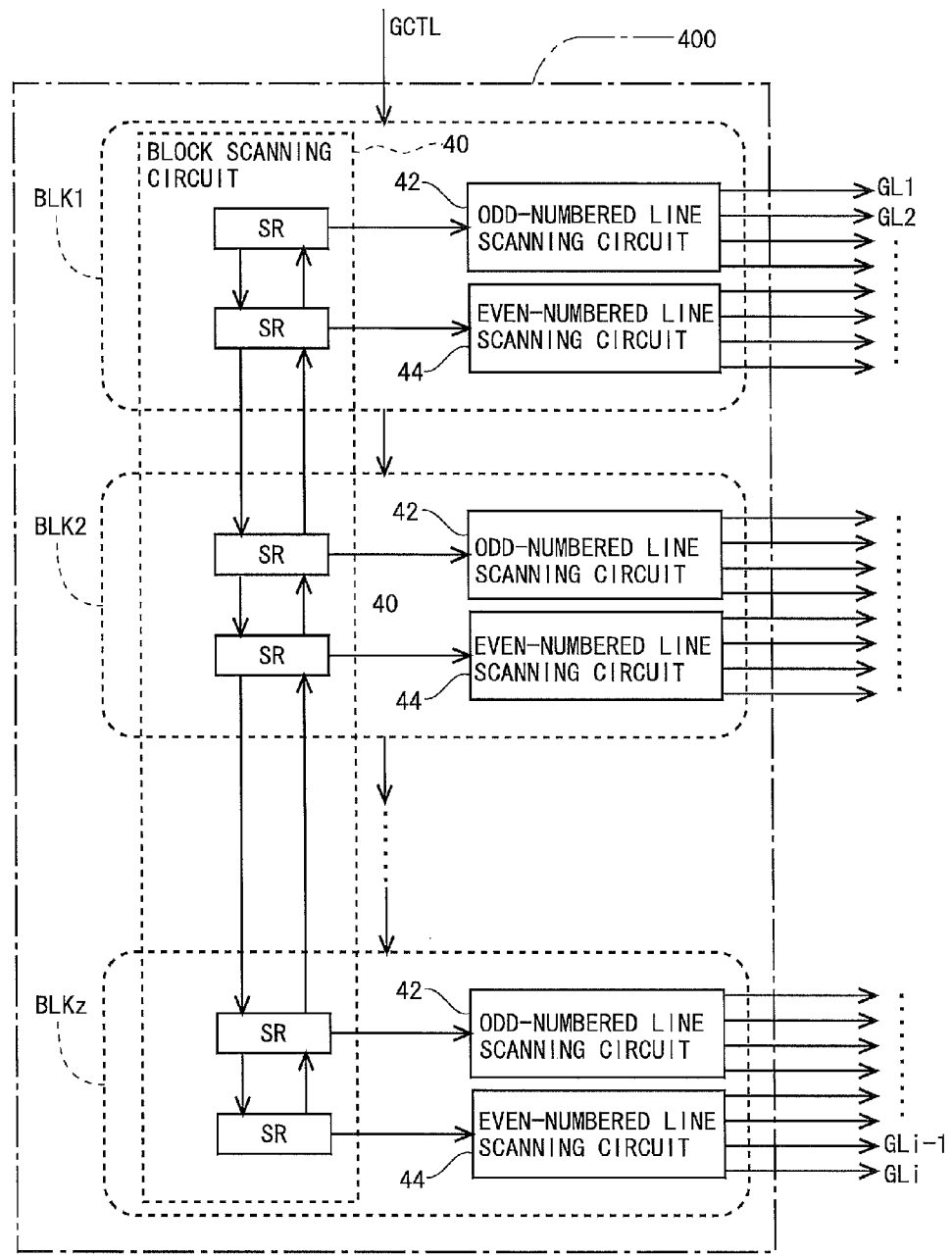
FIG. 3 is a block diagram illustrating a schematic configuration of the gate driver according to this embodiment.

FIG. 3 is a block diagram illustrating a schematic configuration of the gate driver 400 according to this embodiment. In this embodiment, the gate bus lines GL1 to GLi are divided into a plurality of blocks (groups) such that each block includes k consecutive gate bus lines (k is an integer equal to or greater than 4). Here, in the description, it is assumed that the gate bus lines GL1 to GLi are divided into z blocks BLK1 to BLKz (z=i/8) such that each block includes eight gate bus lines.

The gate driver 400 is provided, for each block, with odd-numbered line scanning circuits 42 for driving odd-numbered gate bus lines and even-numbered line scanning circuits 44 for driving even-numbered line gate bus lines. The gate driver 400 is also provided with a block scanning circuit (selection circuit) 40 configured by a shift register having a plurality of stages, and configured to sequentially select the odd-numbered line scanning circuits 42 and the even-numbered line scanning circuits 44. It should be noted that, stages of the shift register are represented by a reference character SR (the same applies to FIG. 1). Further, in the following description, stages corresponding to the odd-numbered line scanning circuits 42 are referred to as "odd-numbered line driving stages", and stages corresponding to the even-numbered line scanning circuits 44 are referred to as "even-numbered line driving stages".

In the configuration as described above, when focusing on the z blocks BLK1 to BLKz, the blocks from the first block BLK1 to the z-th block BLKz are sequentially selected one by one. Further, when focusing on each of the blocks, first, the odd-numbered line scanning circuit 42 sequentially scans the odd-numbered gate bus lines one by one, and then, the even-numbered line scanning circuit 44 sequentially scans the even-numbered gate bus lines one by one.

<2.2 Detailed Configuration of Gate Driver>

Figure 1:
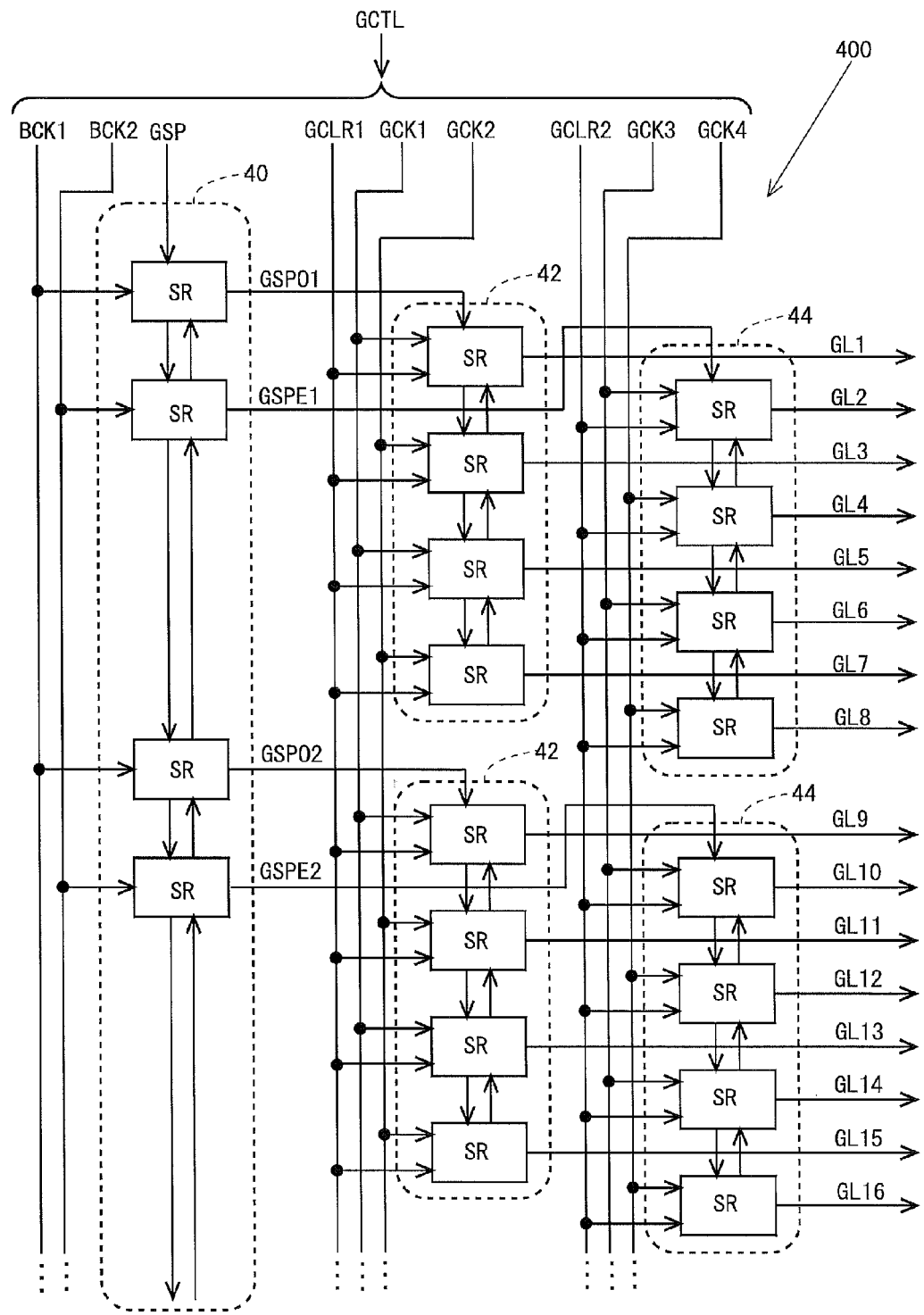
FIG. 1 is a block diagram illustrating a detailed configuration of a gate driver in a liquid crystal display device according to one embodiment of the present invention.

FIG. 1 is a block diagram illustrating a detailed configuration of the gate driver 400 according to this embodiment. Here, FIG. 1 only illustrates a part that corresponds to the gate bus lines GL1 to GL16 of the first to sixteenth lines. As described above, the gate driver 400 includes the block scanning circuit 40, the odd-numbered line scanning circuits 42 each provided for each block, and the even-numbered line scanning circuits 44 each provided for each block. The block scanning circuit 40, each of the odd-numbered line scanning circuits 42, and each of the even-numbered line scanning circuits 44 are configured by a shift register having a plurality of stages. It should be noted that, in the example of this description, each of the odd-numbered line scanning circuits 42 and each of the even-numbered line scanning circuits 44 are configured by a shift register having four stages. Each stage of the shift register takes one of two states (a first state and a second state) at one time point, and outputs a signal indicating this state (hereinafter referred to as a "state signal"). Further, in the following description, a circuit that constitutes a single stage of the shift register is also called a "stage constituent circuit".

As illustrated in FIG. 1, as the gate control signal GCTL, the gate driver 400 is supplied with a start pulse signal GSP including a pulse for starting an operation of the shift register within the block scanning circuit 40, two clock signals BCK1 and BCK2 for controlling a shifting operation of the shift register within the block scanning circuit 40, two clock signals GCK1 and GCK2 for controlling a shifting operation of the shift register within the odd-numbered line scanning circuit 42, a clear signal GCLR1 including a pulse for completely clearing the state of the shift register within the odd-numbered line scanning circuit 42, two clock signals GCK3 and GCK4 for controlling a shifting operation of the shift register within the even-numbered line scanning circuit 44, and a clear signal GCLR2 including a pulse for completely clearing the state of the shift register within the even-numbered line scanning circuit 44.

Upon reception of the pulse of the start pulse signal GSP, the block scanning circuit 40 transfers the pulse sequentially from the first stage to the last stage (2z-th stage) of the shift register based on the two clock signals BCK1 and BCK2. Along with this shifting operation, an odd-numbered stage outputs a start pulse signal GSPOp (p=1 to z) including the pulse for starting the operation of the shift register within the odd-numbered line scanning circuit 42, and an even-numbered stage outputs a start pulse signal GSPEq (q=1 to z) including the pulse for starting the operation of the shift register within the even-numbered line scanning circuit 44.

Upon reception of the pulse of the start pulse signal GSPOp, the odd-numbered line scanning circuit 42 transfers this pulse sequentially from the first stage to the last stage (fourth stage) of the shift register based on the two clock signals GCK1 and GCK2. Along with this shifting operation, the scanning pulses for sequentially and selectively driving the odd-numbered gate bus lines are sequentially outputted from the shift register that constitutes the odd-numbered line scanning circuit 42. Upon reception of the pulse of the start pulse signal GSPEq, the even-numbered line scanning circuit 44 transfers this pulse sequentially from the first stage to the last stage (fourth stage) of the shift register based on the two clock signals GCK3 and GCK4. Along with this shifting operation, the scanning pulses for sequentially and selectively driving the even-numbered gate bus lines are sequentially outputted from the shift register that constitutes the even-numbered line scanning circuit 44.

<2.3 Configuration of Stage Constituent Circuit>

Figure 4:
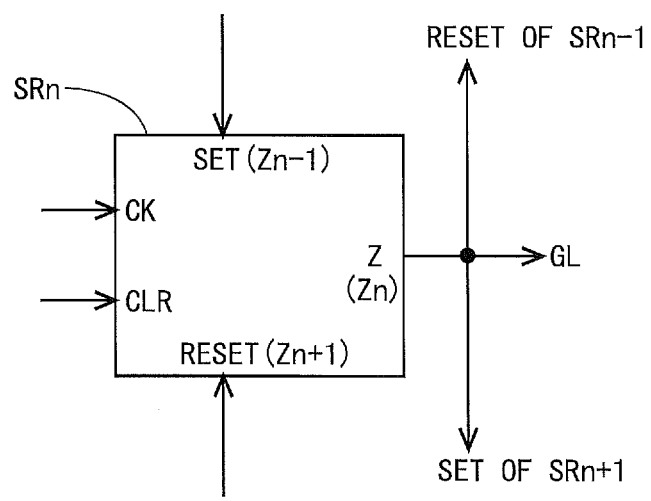
FIG. 4 is a diagram for illustration of signals inputted to and outputted from an n-th stage constituent circuit of each of shift registers included respectively in an odd-numbered line scanning circuit and an even-numbered line scanning circuit in this embodiment.

FIG. 4 is a diagram for illustration of signals inputted to and outputted from a stage constituent circuit SRn of an n-th stage of the shift register included in each of the odd-numbered line scanning circuit 42 and the even-numbered line scanning circuit 44. Each stage constituent circuit is supplied with a clock signal CK, a clear signal CLR, a set signal SET, and a reset signal RESET. Further, each stage constituent circuit outputs a state signal Z indicating the state at one time point. The clock signal CK is one of the four clock signals GCK1 to GCK4. The clear signal CLR is one of the two clear signals GCLR1 and GCLR2. The stage constituent circuit SRn of the n-th stage is supplied with a state signal Zn−1 outputted from a stage constituent circuit SRn−1 of an (n−1)th stage as the set signal SET, and a state signal Zn+1 outputted from a stage constituent circuit SRn+1 of an (n+1)th stage as the reset signal RESET. Further, the state signal Zn outputted from the stage constituent circuit SRn of the n-th stage is applied to one of the gate bus lines GL corresponding to this stage constituent circuit SRn as a scanning signal, to the stage constituent circuit SRn−1 of the (n−1)th stage as the reset signal RESET, and to the stage constituent circuit SRn+1 of the (n+1)th stage as the set signal SET.

Figure 5:
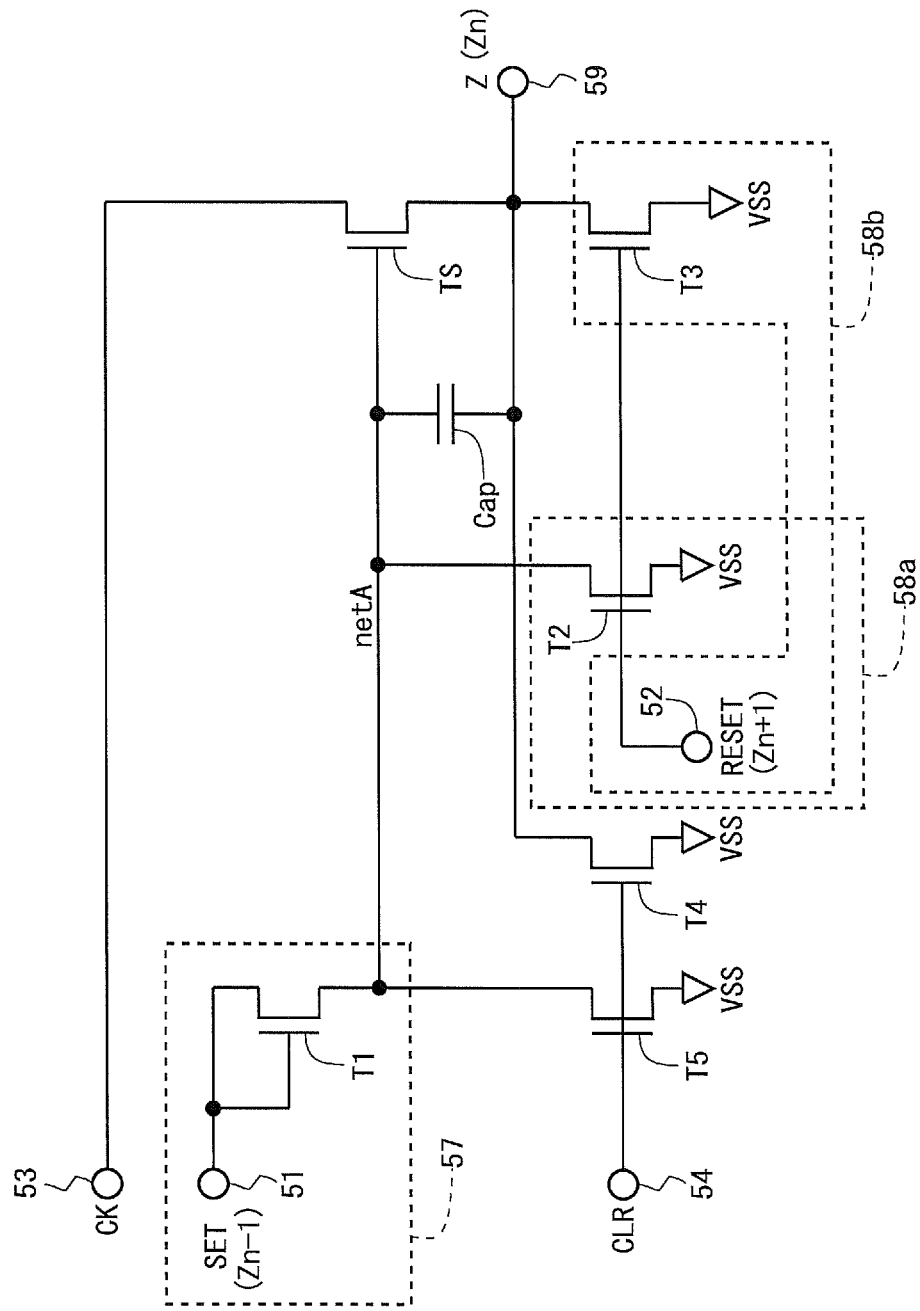
FIG. 5 is a circuit diagram illustrating a configuration of a stage constituent circuit (a configuration of a single stage of the shift register) according to this embodiment.

FIG. 5 is a circuit diagram illustrating a configuration of the stage constituent circuit (a configuration of a single stage of the shift register) according to this embodiment. As illustrated in FIG. 5, this stage constituent circuit is provided with six thin-film transistors TS and T1 to T5, and one capacitor (capacitative element) Cap. All of the six thin-film transistors TS and T1 to T5 are of an N-channel type. Additionally, this stage constituent circuit also includes four input terminals 51 to 54 and one output terminal (output node) 59, in addition to an input terminal for a low-level direct-current power supply potential VSS. Here, an input terminal for receiving the set signal SET is indicated by the reference character 51, an input terminal for receiving the reset signal RESET is indicated by the reference character 52, an input terminal for receiving the clock signal CK is indicated by the reference character 53, and an input terminal for receiving the clear signal CLR is indicated by the reference character 54. In addition, an output terminal for outputting the state signal Z is indicated by the reference character 59.

Agate terminal of the thin-film transistor TS, a source terminal of the thin-film transistor T1, a drain terminal of the thin-film transistor T2, a drain terminal of the thin-film transistor T5, and one terminal of the capacitor Cap are connected to each other. As used herein, a region (wiring) in which these terminals are connected to each other is referred to as a "netA" (first node) for convenience sake.

As for the thin-film transistor TS, the gate terminal is connected to the netA, a drain terminal is connected to the input terminal 53, and a source terminal is connected to the output terminal 59. As for the thin-film transistor T1, a gate terminal and a drain terminal are connected to the input terminal 51 (that is, diode-connected), and the source terminal is connected to the netA. As for the thin-film transistor T2, agate terminal is connected to the input terminal 52, the drain terminal is connected to the netA, and a source terminal is connected to the input terminal for the direct-current power supply potential VSS. As for the thin-film transistor T3, a gate terminal is connected to the input terminal 52, a drain terminal is connected to the output terminal 59, and a source terminal is connected to the input terminal for the direct-current power supply potential VSS. As for the thin-film transistor T4, a gate terminal is connected to the input terminal 54, a drain terminal is connected to the output terminal 59, and a source terminal is connected to the input terminal for the direct-current power supply potential VSS. As for the thin-film transistor T5, a gate terminal is connected to the input terminal 54, the drain terminal is connected to the netA, and a source terminal is connected to the input terminal for the direct-current power supply potential VSS. As for the capacitor Cap, the one terminal is connected to the netA, and the other terminal is connected to the output terminal 59.

It should be noted that in this embodiment, the thin-film transistor TS realizes an output-controlling switching element, the thin-film transistor T1 realizes a first switching element, the thin-film transistor T2 realizes a second switching element, the thin-film transistor T3 realizes a third switching element, the thin-film transistor T4 realizes a fourth switching element, and the thin-film transistor T5 realizes a fifth switching element. Further, in this embodiment, a section indicated by a reference character 57 in FIG. 5 realizes a first-node charging unit, a section indicated by a reference character 58a in FIG. 5 realizes a first-node discharging unit, and a section indicated by a reference character 58b in FIG. 5 realizes an output-node discharging unit.

<3. Driving Method>
<3.1 Operation of Stage Constituent Circuit>

Figure 6:
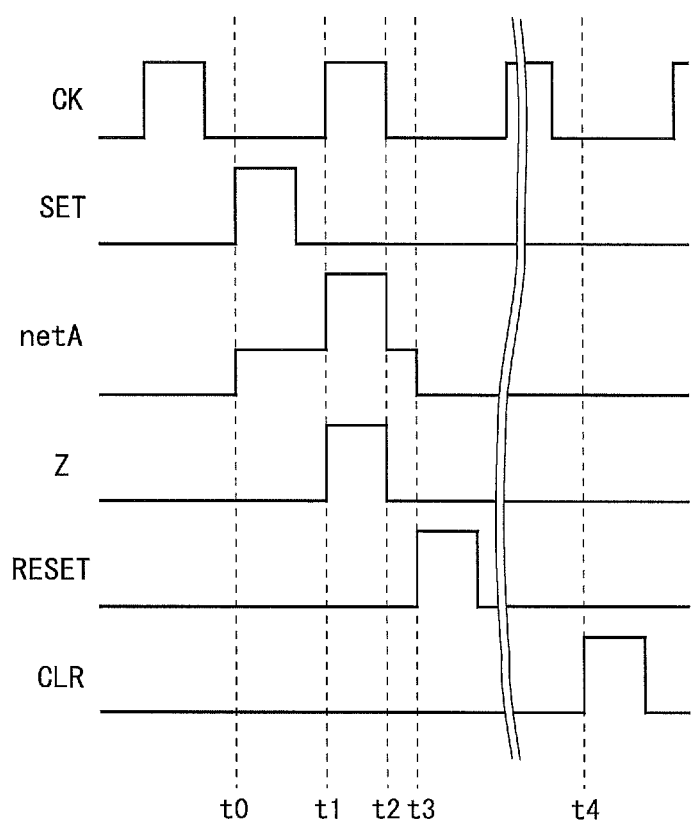
FIG. 6 is a signal waveform diagram for illustration of an operation of the stage constituent circuit according to this embodiment.

An operation of the stage constituent circuit according to this embodiment will be described with reference to FIG. 5 and FIG. 6. During the operation of this liquid crystal display device, the clock signal CK that is driven to a high level for a predetermined period with a predetermined cycle as illustrated in FIG. 6 is supplied to the input terminal 53.

During a period before a time point to, a potential of the netA and a potential of the state signal Z (a potential of the output terminal 59) are at a low level. At the time point t0, the input terminal 51 is supplied with a pulse of the set signal SET. As the thin-film transistor T1 is diode-connected as illustrated in FIG. 5, the pulse of the set signal SET turns the thin-film transistor T1 to an ON state, and the capacitor Cap is charged. With this, the potential of the netA changes from the low level to a high level, and the thin-film transistor TS is turned to an ON state. In the meantime, during a period from the time point t0 to a time point t1, the clock signal CK is at the low level. Therefore, during this period, the state signal Z is maintained at the low level.

At the time point t1, the clock signal CK changes from the low level to the high level. At this time, as the thin-film transistor TS is in the ON state, the potential of the output terminal 59 increases as a potential of the input terminal 53 increases. Here, as the capacitor Cap is provided between the netA and the output terminal 59 as illustrated in FIG. 5, the potential of the netA also increases (the netA is bootstrapped) as the potential of the output terminal 59 increases. As a result, a large voltage is applied to the thin-film transistor TS, and the potential of the state signal Z increases up to the potential of the clock signal CK at the high level. This turns the gate bus line connected to the output terminal 59 of this stage constituent circuit to a selected state.

At a time point t2, the clock signal CK changes from the high level to the low level. With this, the potential of the output terminal 59 decreases as the potential of the input terminal 53 decreases, and the potential of the netA also decreases via the capacitor Cap. However, as the potential of the netA decreases substantially only by an amount of the decrease of the potential of the output terminal 59, the potential of the netA does not drop down to the low level and is maintained at the high level.

At a time point t3, the input terminal 52 is supplied with a pulse of the reset signal RESET. This turns the thin-film transistor T2 and the thin-film transistor T3 to the ON state. By the thin-film transistor T2 being turned to the ON state, the potential of the netA changes from the high level to the low level, and by the thin-film transistor T3 being turned to the ON state, the potential of the output terminal 59 is pulled to the low-level direct-current power supply potential VSS.

At a time point t4, the input terminal 54 is supplied with a pulse of the clear signal CLR. This turns the thin-film transistor T4 and the thin-film transistor T5 to the ON state. By the thin-film transistor T4 being turned to the ON state, the potential of the output terminal 59 is pulled to the low-level direct-current power supply potential VSS, and by the thin-film transistor T5 being turned to the ON state, the potential of the netA is pulled to the low-level direct-current power supply potential VSS.

<3.2 Operation of Gate Driver as a Whole>

Figure 7:
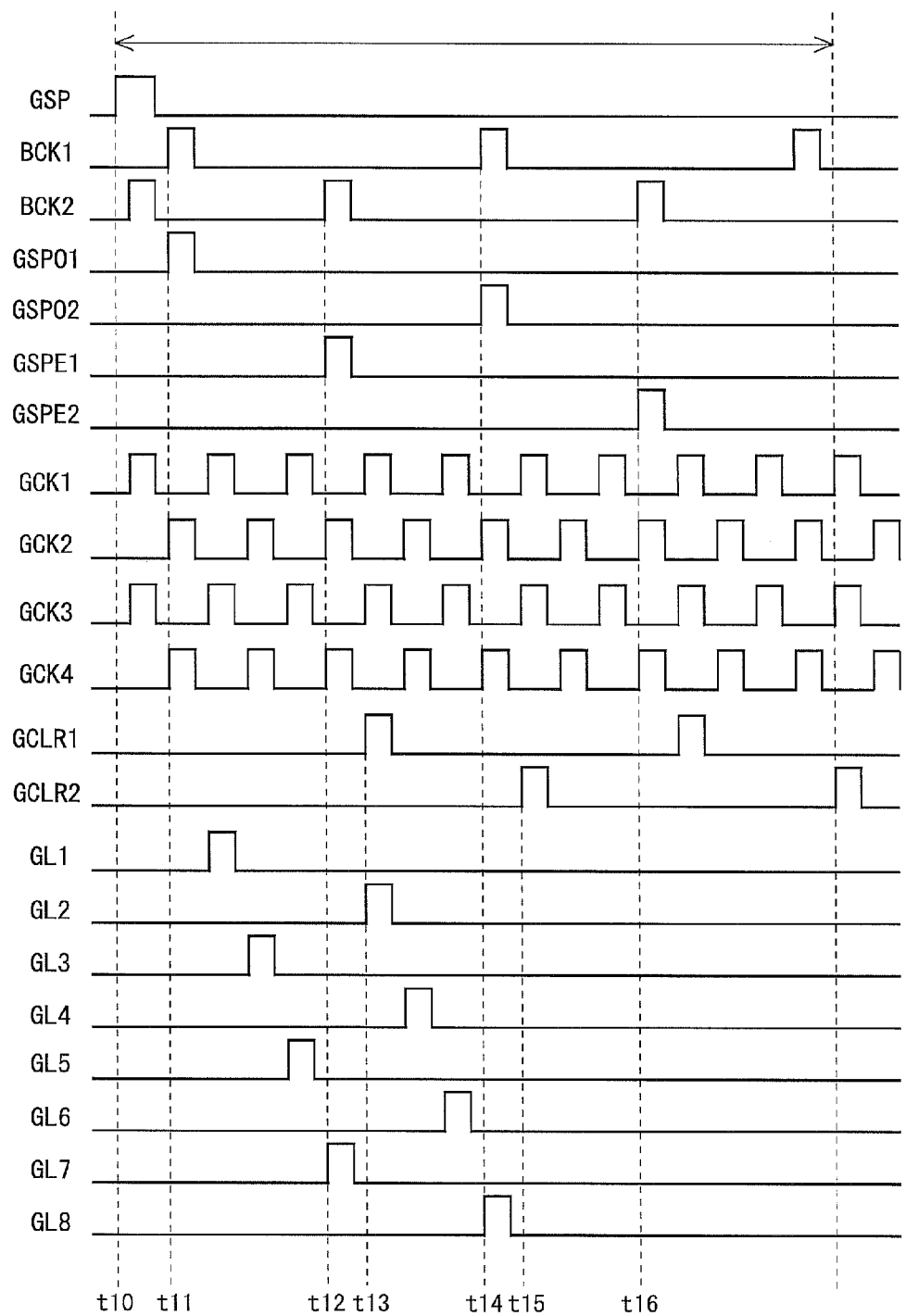
FIG. 7 is a signal waveform diagram for illustration of an operation of the gate driver as a whole according to this embodiment.

Hereinafter, based on the operation of the stage constituent circuit described above, an operation of the gate driver 400 as a whole according to this embodiment will be described with reference to FIG. 7. While the description here focuses on the block BLK1 (see FIG. 3), the same applies to the other blocks BLK2 to BLKz.

First, at a time point t10, the odd-numbered line driving stage is supplied with a pulse of the start pulse signal GSP. The odd-numbered line driving stage outputs a pulse of a start pulse signal GSPO1 at timing (a time point t11) at which a pulse of the clock signal BCK1 is first received after the time point t10. The pulse of the start pulse signal GSPO1 outputted from the odd-numbered line driving stage is supplied to the even-numbered line driving stage, as well as to the first stage of the shift register within the odd-numbered line scanning circuit 42. The even-numbered line driving stage outputs a pulse of a start pulse signal GSPE1 at timing (a time point t12) at which a pulse of the clock signal BLK2 is first received after receiving the pulse of the start pulse signal GSPO1 outputted from the odd-numbered line driving stage. The pulse of the start pulse signal GSPE1 outputted from the even-numbered line driving stage is supplied to the odd-numbered line driving stage, as well as to the first stage of the shift register within the even-numbered line scanning circuit 44.

The odd-numbered line scanning circuit 42 sequentially outputs scanning pulses to the odd-numbered gate bus lines GL1, GL3, GL5, and GL7 based on the two clock signals GCK1 and GCK2 after the pulse of the start pulse signal GSPO1 is supplied to the first stage of the shift register (after the time point t11). The even-numbered line scanning circuit 44 sequentially outputs scanning pulses to the even-numbered gate bus lines GL2, GL4, GL6, and GL8 based on the two clock signals GCK3 and GCK4 after the pulse of the start pulse signal GSPE1 is supplied to the first stage of the shift register (after the time point t12). In this manner, focusing on the gate bus lines GL1 to GL8 of the first to eighth lines, the scanning pulses are supplied in the order of "GL1, GL3, GL5, GL7, GL2, GL4, GL6, and GL8" as illustrated in FIG. 7.

At a time point t14, the pulse of the clock signal BCK1 rises, and at a time point t16, the pulse of the clock signal BCK2 rises. With this, the same operation as in the block BLK1 is performed in the block BLK2. Thereafter, the same operation as in the block BLK1 is performed also in the blocks BLK3 to BLKz.

It should be noted that, at a time point t13, a pulse of the clear signal GCLR1 rises. With this, all the stage constituent circuits that constitute the shift register within the odd-numbered line scanning circuit 42 are completely cleared. Further, at a time point t15, a pulse of the clear signal GCLR2 rises. With this, all of the stage constituent circuits that constitute the shift register within the even-numbered line scanning circuit 44 are made to be in completely clear states.

<4. Effects>

Figure 12:
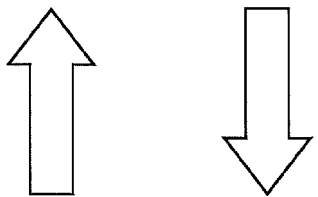
FIG. 12 is a diagram showing polarities of pixel voltages in two consecutive frame periods in a case in which line-reversal driving is employed.
Figure 13:
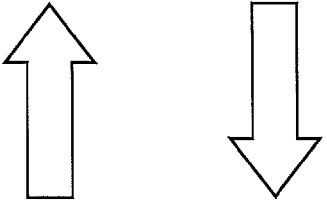
FIG. 13 is a diagram showing polarities of pixel voltages in two consecutive frame periods in a case in which dot-reversal driving is employed.
Figure 14:
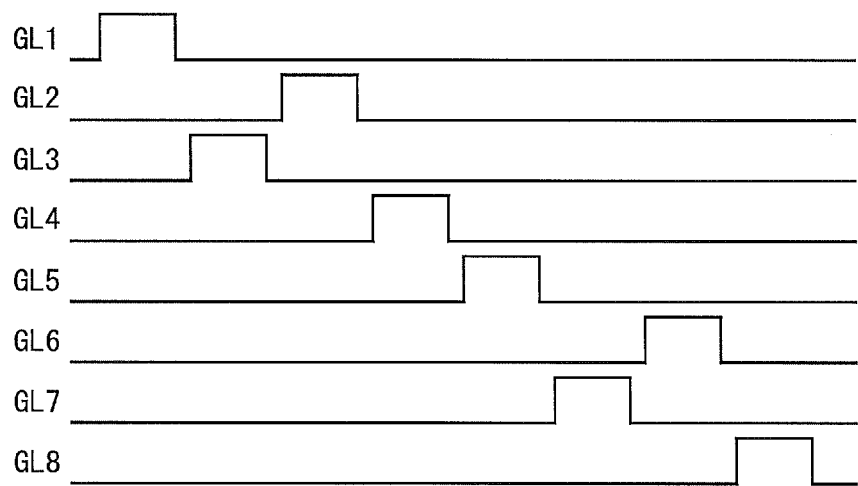
FIG. 14 is a waveform diagram of scanning signals in a case in which block-reversal driving is employed.

According to this embodiment, the gate bus lines GL1 to GLi are divided into the plurality of blocks such that each block includes eight gate bus lines. When focusing on each of the blocks, interlaced scanning is performed to the eight gate bus lines. Specifically, in first vertical scanning, the four odd-numbered gate bus lines are sequentially selected one by one, and then in second vertical scanning, the four even-numbered gate bus lines are sequentially selected one by one. Therefore, by reversing polarities of each video signal between the first vertical scanning and the second vertical scanning, and by also reversing polarities of each video signal every single frame period, polarities of the pixel voltages in two consecutive frame periods become as illustrated in FIG. 12. Further, by reversing polarities of the video signals applied to adjacent source bus lines, the polarities of the pixel voltages in the two consecutive frame periods become as illustrated in FIG. 13. As described above, in this embodiment, block-reversal driving is performed.

Figure 8:
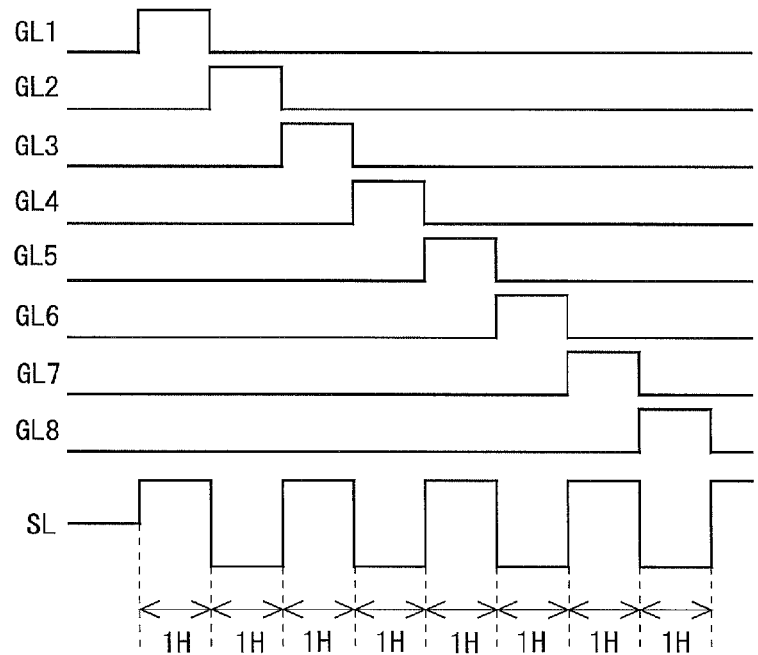
FIG. 8 is a waveform diagram of scanning signals and video signals in a typical display device.
Figure 9:
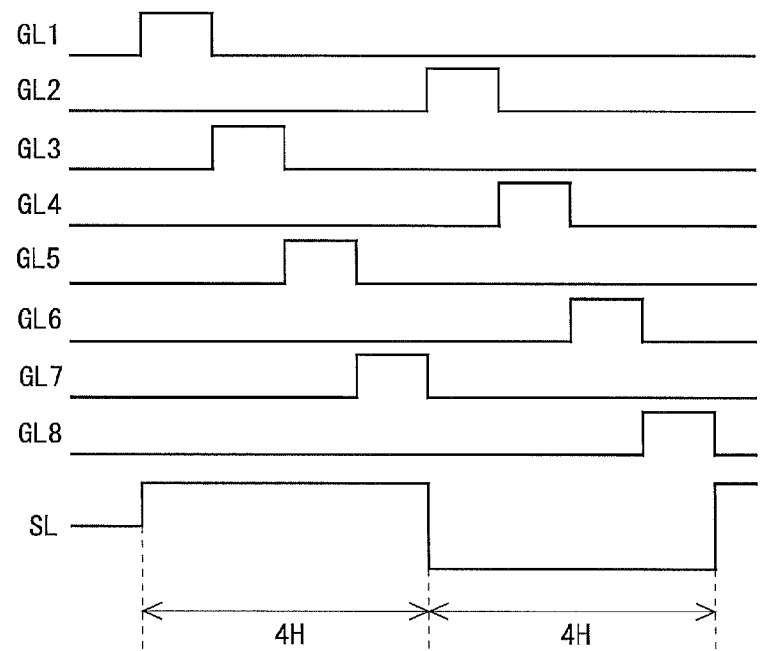
FIG. 9 is a waveform diagram of scanning signals and video signals according to this embodiment.

When line-reversal driving or dot-reversal driving is employed for a typical liquid crystal display device, the gate bus lines are sequentially selected one by one, and polarity reversal for the video signals is performed every single horizontal scanning period, as illustrated in FIG. 8. By contrast, according to this embodiment, for each block, the four odd-numbered gate bus lines are sequentially selected one by one, and then the four even-numbered gate bus lines are sequentially selected one by one, as illustrated in FIG. 9. Accordingly, the polarities of the pixel voltages as illustrated in FIG. 12 or FIG. 13 may be obtained by reversing the polarities of the video signals every four horizontal scanning periods as illustrated in FIG. 9. Thus, the number of the polarity reversals of the video signals performed in a single frame period is reduced. With this, it is possible to reduce power consumption while maintaining high-quality display.

As described above, according to this embodiment, it is possible to realize a monolithic gate driver capable of performing the block-reversal driving without causing deterioration of display quality or an increase in power consumption.

In the meantime, as for an amorphous silicon, it is not possible to employ a CMOS configuration, because the mobility of P-type is low. In this regard, focusing on the shift register within the gate driver 400 according to this embodiment, the switching element is constituted by only N-channel type TFTs. Therefore, in a display device, such as a large-sized liquid crystal panel, in which an amorphous silicon TFT is employed as a drive element, it is also possible to realize a monolithic gate driver capable of performing the block-reversal driving. Further, according to this embodiment, the shift register within the gate driver 400 can be realized such that all of the stages are configured as circuits of the same and relatively simple configuration.

5. Modified Examples

While the above embodiment has been described taking the example in which the amorphous silicon TFT is employed as the drive element, the present invention is not limited to such an example. Hereinafter, modified examples of the TFT employed as the drive element will be described.

5.1 First Modified Example

First, an example in which a TFT using IGZO that is one type of amorphous oxide semiconductor (hereinafter referred to as an "IGZO-TFT") is employed as the drive element will be described. IGZO is N-type oxide semiconductor mainly consisting of indium (In), gallium (Ga), zinc (Zn), and oxygen (O). As IGZO is N-type oxide semiconductor, each stage (stage constituent circuit) of the shift register within the gate driver can be configured to have the same configuration as in the embodiment described above (see FIG. 5).

One characteristic of IGZO is high mobility. Accordingly, by employing the IGZO-TFT as the drive element, it is possible to improve a driving capability of the gate driver 400 and to provide a slimmer picture-frame by reducing a size of the TFT. Further, as a load capacitance is reduced, it is possible to further reduce the power consumption as compared to the embodiment described above. Moreover, the IGZO-TFT also has a characteristic of low leakage. Accordingly, in the circuit using bootstrap (see FIG. 5), for example, it is possible to suppress an occurrence of a faulty operation due to a leakage of an electric charge from a floating node (a node in an electrically floating state, namely, the netA in FIG. 5 during the period from the time point t1 to the time point t2 in FIG. 6), and to increase an operation margin.

5.2 Second Modified Example

Next, an example in which a polycrystalline silicon TFT (p-Si TFT) is employed as the drive element will be described. As for the polycrystalline silicon TFT, unlike the amorphous silicon TFT, it is possible to employ the CMOS configuration. Therefore, in this modified example, each stage (stage constituent circuit) of the shift register within the gate driver 400 has a configuration using a CMOS logic circuit.

Figure 10:
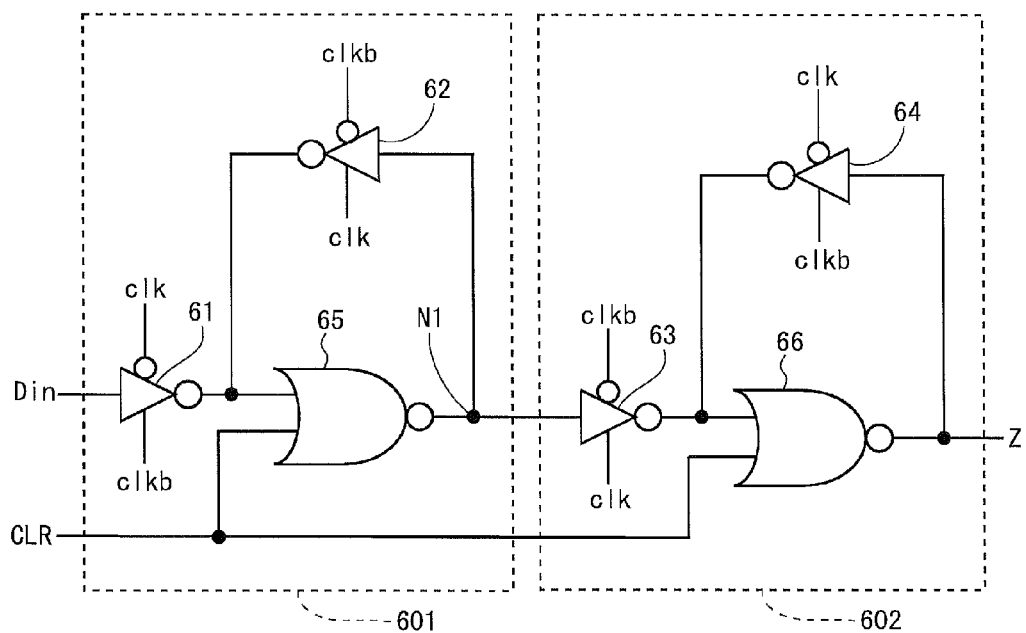
FIG. 10 is a circuit diagram illustrating a configuration of a stage constituent circuit (a configuration of a single stage of the shift register) according to a second modified example of this embodiment.

FIG. 10 is a circuit diagram illustrating a configuration of the stage constituent circuit (a configuration of a single stage of the shift register) according to this modified example. As illustrated in FIG. 10, this stage constituent circuit is provided with four clocked inverters 61 to 64 and two NOR circuits 65 and 66. All of the four clocked inverters 61 to 64 and the two NOR circuits 65 and 66 have a circuit configuration using CMOS. A description of a specific circuit configuration for these components shall be omitted as a known configuration can be employed.

The clocked inverters 61 and 64 serve as inverters when a clock signal clk is at a low level and a clock signal clkb is at a high level, and an input terminal and an output terminal of the clocked inverters 61 and 64 are electrically separated when the clock signal clk is at the high level and the clock signal clkb is at the low level. The clocked inverters 62 and 63 serve as inverters when the clock signal clk is at the high level and the clock signal clkb is at the low level, and an input terminal and an output terminal of the clocked inverters 62 and 63 are electrically separated when the clock signal clk is at the low level and the clock signal clkb is at the high level. The NOR circuits 65 and 66 each output a signal indicating negative OR of signals supplied to two input terminals. As for the NOR circuit 65, one of the input terminals is supplied with output signals from the clocked inverters 61 and 62, and the other of the input terminals is supplied with the clear signal CLR. Further, an output signal from the NOR circuit 65 is supplied to the clocked inverters 62 and 63. As for the NOR circuit 66, one of the input terminals is supplied with output signals from the clocked inverters 63 and 64, and the other of the input terminals is supplied with the clear signal CLR. Moreover, an output signal from the NOR circuit 66 is supplied to the clocked inverter 64, and outputted from this stage constituent circuit as the state signal Z.

As described above, in this stage constituent circuit, a logical value of an input signal (input data) Din supplied to the clocked inverter 61 during a period in which the clear signal CLR is at the low level, the clock signal clk is at the low level, and the clock signal clkb is at the high level is held temporarily at a node N1. Then, at timing at which the clock signal clk changes from the low level to the high level and the clock signal clkb changes from the high level to the low level, the logical value of the data held temporarily at the node N1 appears as a waveform of the state signal Z. In this manner, this stage constituent circuit operates as a master-slave type D flip flop including a master flip flop (a section indicated by a reference character 601 in FIG. 10) and a slave flip flop (a section indicated by a reference character 602 in FIG. 10).

Figure 11:
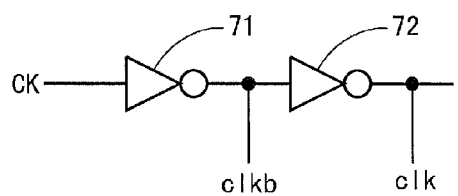
FIG. 11 is a circuit diagram illustrating a configuration for generating clock signals clk and clkb based on a clock signal CK according to the second modified example of this embodiment.

Here, the two clock signals clk and clkb supplied to the clocked inverters 61 to 64 are generated based on the clock signal CK by circuits illustrated in FIG. 11 configured as two inverters 71 and 72. Similarly to the embodiment described above, the clock signal CK is one of the four clock signals GCK1 to GCK4. On the basis of the configuration illustrated in FIG. 11, when the clock signal CK is at the high level, the clock signal clk is at the high level and the clock signal clkb is at the low level. By contrast, when the clock signal CK is at the low level, the clock signal clk is at the low level and the clock signal clkb is at the high level.

In the above configuration, one of the start pulse signal and the state signal Zn−1 outputted from a previous stage is supplied to the clocked inverter 61 as the input signal Din. For example, when a scanning pulse for the first gate bus line GL1 rises, data indicating a logical value "1" is held temporarily at the node N1 in a stage constituent circuit corresponding to the third gate bus line GL3, based on the scanning pulse and the clock signal GCK2. Then, by the clock signal GCK2 changing from the low level to the high level at a time point when a single horizontal scanning period has passed after the rising time of the scanning pulse for the first gate bus line GL1, the state signal Z outputted from the stage constituent circuit corresponding to the third gate bus line GL3 is driven to the high level. In this manner, at the time point when a single horizontal scanning period has passed after the scanning pulse for the first gate bus line GL1 has risen, a scanning pulse for the third gate bus line GL3 rises.

As described above, even when the stage constituent circuits that constitute the shift register are configured using the CMOS logic circuits as illustrated in FIG. 10, it is possible to allow the gate driver 400 to operate in the same manner as in the embodiment described above. As the stage constituent circuits are configured using the CMOS logic circuits, it is possible to reduce power consumption as compared to the embodiment described above. Further, also in this modified example, the shift register within the gate driver 400 can be realized such that all of the stages are configured as circuits of the same and relatively simple configuration.

<6. Others>

While the above embodiment has been described taking the liquid crystal display device as an example, the present invention is not limited to such an example. The present invention can be applied to other display devices such as organic EL (Electro Luminescence).

DESCRIPTION OF REFERENCE CHARACTERS

40: BLOCK SCANNING CIRCUIT
42: ODD-NUMBERED LINE SCANNING CIRCUIT
44: EVEN-NUMBERED LINE SCANNING CIRCUIT
51 to 54: INPUT TERMINAL (OF STAGE CONSTITUENT CIRCUIT)
59: OUTPUT TERMINAL (OF STAGE CONSTITUENT CIRCUIT)
100: DISPLAY UNIT
200: DISPLAY CONTROL CIRCUIT
300: SOURCE DRIVER (VIDEO SIGNAL LINE DRIVE CIRCUIT)
400: GATE DRIVER (SCANNING SIGNAL LINE DRIVE CIRCUIT)
BLK1 to BLKz: BLOCK
SR: STAGE CONSTITUENT CIRCUIT (STAGE OF SHIFT REGISTER)
Cap: CAPACITOR (CAPACITATIVE ELEMENT)
TS, T1 to T5: THIN-FILM TRANSISTOR (TFT)
GL1 to Gli: GATE BUS LINE
SL1 to Slj: SOURCE BUS LINE

The invention claimed is:

1. A scanning signal line drive circuit provided monolithically on a substrate that constitutes a display panel, and for driving a plurality of scanning signal lines arranged on the substrate, the scanning signal line drive circuit comprising:
  a plurality of odd-numbered line scanning circuits configured to drive odd-numbered scanning signal lines out of the plurality of scanning signal lines;
  a plurality of even-numbered line scanning circuits configured to drive even-numbered scanning signal lines out of the plurality of scanning signal lines; and
  a selection circuit configured to select a circuit to be activated out of the plurality of odd-numbered line scanning circuits and the plurality of even-numbered line scanning circuits, wherein
  the plurality of scanning signal lines are divided into z blocks (z is an integer equal to or greater than 2) such that each block includes k consecutive scanning signal lines (k is an integer equal to or greater than 4),
  one of the odd-numbered line scanning circuits and one of the even-numbered line scanning circuits are provided for each block,
  the selection circuit sequentially selects the first to z-th blocks one by one, and alternately selects the odd-numbered line scanning circuits and the even-numbered line scanning circuits,
  each of the odd-numbered line scanning circuits sequentially and selectively drives the odd-numbered scanning signal lines that are included in the corresponding block,
  each of the even-numbered line scanning circuits sequentially and selectively drives the even-numbered scanning signal lines that are included in the corresponding block,
  the selection circuit, the odd-numbered line scanning circuits, and the even-numbered line scanning circuits are each configured by a shift register having a plurality of stages each configured to output, based on an externally inputted clock signal, a state signal indicating one of a first state and a second state, and
  each of the stages that constitute the shift register includes:
    an output node for outputting the state signal;
    an output-controlling switching element having a second electrode to which the clock signal is supplied and a third electrode connected to the output node;
    a first node connected to a first electrode of the output-controlling switching element;
    a capacitative element provided between the output node and the first node;
    a first-node charging unit configured to charge the first node based on one of a start instructing signal and the state signal outputted from the output node of a previous stage;
    a first-node discharging unit configured to discharge the first node based on the state signal outputted from the output node of a next stage; and an output-node discharging unit configured to discharge the output node based on the state signal outputted from the output node of the next stage.

2. The scanning signal line drive circuit according to claim 1, wherein
in each of the stages that constitute the shift register, the clock signal supplied to the second electrode of the output-controlling switching element changes from a low level to a high level, after the first node is charged by the first-node charging unit and before the first node is discharged by the first-node discharging unit.

3. The scanning signal line drive circuit according to claim 1, wherein
a first stage of the shift register that constitutes the odd-numbered line scanning circuit is supplied with, as the start instructing signal, the state signal outputted from an odd-numbered stage of the shift register that constitutes the selection circuit,
a first stage of the shift register that constitutes the even-numbered line scanning circuit is supplied with, as the start instructing signal, the state signal outputted from an even-numbered stage of the shift register that constitutes the selection circuit,
the odd-numbered scanning signal lines out of the plurality of scanning signal lines are each supplied with, as a scanning signal, the state signal outputted from each stage of the shift register that constitutes the odd-numbered line scanning circuit, and
the even-numbered scanning signal lines out of the plurality of scanning signal lines are each supplied with, as the scanning signal, the state signal outputted from each stage of the shift register that constitutes the even-numbered line scanning circuit.

4. The scanning signal line drive circuit according to claim 1, wherein
in each of the stages that constitute the shift register,
the first-node charging unit includes a first switching element having a first electrode and a second electrode to both of which the state signal outputted from the output node of the previous stage is supplied and a third electrode connected to the first node, and
the first-node discharging unit includes a second switching element having a first electrode to which the state signal outputted from the output node of the next stage is supplied, a second electrode connected to the first node, and a third electrode to which a low level potential is supplied.

5. The scanning signal line drive circuit according to claim 1, wherein
in each of the stages that constitute the shift register,
the output-node discharging unit includes a third switching element having a first electrode to which the state signal outputted from the output node of the previous stage is supplied, a second electrode connected to the output node, and a third electrode to which a low level potential is supplied.

6. The scanning signal line drive circuit according to claim 1, wherein
each of the stages that constitute the shift register further includes a fourth switching element having a first electrode to which an externally inputted clear signal is supplied, a second electrode connected to the output node, and a third electrode to which a low level potential is supplied.

7. The scanning signal line drive circuit according to claim 1, wherein
each of the stages that constitute the shift register further includes a fifth switching element having a first electrode to which an externally inputted clear signal is supplied, a second electrode connected to the first node, and a third electrode to which a low level potential is supplied.

8. The scanning signal line drive circuit according to claim 1, wherein
the switching element included in each of the stages that constitute the shift register is a thin-film transistor made of amorphous silicon.

9. The scanning signal line drive circuit according to claim 1, wherein
the switching element included in each of the stages that constitute the shift register is a thin-film transistor made of N-type oxide semiconductor comprising indium, gallium, zinc, and oxygen.

10. A display device, comprising:
the scanning signal line drive circuit according to claim 1; and
a video signal line drive circuit configured to drive a plurality of video signal lines provided on the substrate, wherein
focusing on video signals applied respectively to the video signal lines, the video signal line drive circuit makes polarities of the video signals when the odd-numbered line scanning circuit is selected by the selection circuit different from the polarities of the video signals when the even-numbered line scanning circuit is selected by the selection circuit.

11. The display device according to claim 10, wherein
the video signal line drive circuit makes polarities of the video signals applied to two adjacent video signal lines different from each other.

\* \* \* \* \*